United States Patent
Sato

(10) Patent No.: US 11,853,139 B2
(45) Date of Patent: Dec. 26, 2023

(54) CLOCK AND DATA SIGNAL TRANSMISSION IN A MASTER/SLAVE PMIC SYSTEM

(71) Applicant: ROHM Co., LTD., Kyoto (JP)

(72) Inventor: Kiminobu Sato, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 310 days.

(21) Appl. No.: 17/142,424

(22) Filed: Jan. 6, 2021

(65) Prior Publication Data

US 2021/0208658 A1 Jul. 8, 2021

(30) Foreign Application Priority Data

Jan. 8, 2020 (JP) .................................. 2020-001708

(51) Int. Cl.
| | |
|---|---|
| G06F 1/3203 | (2019.01) |
| H04L 7/00 | (2006.01) |
| G06F 1/04 | (2006.01) |
| H02M 3/156 | (2006.01) |
| G06F 1/26 | (2006.01) |
| G06F 1/10 | (2006.01) |

(52) U.S. Cl.
CPC ............ *G06F 1/3203* (2013.01); *G06F 1/04* (2013.01); *H02M 3/156* (2013.01); *H04L 7/0008* (2013.01); *G06F 1/10* (2013.01); *G06F 1/26* (2013.01)

(58) Field of Classification Search
CPC . G06F 1/3203; G06F 1/04; G06F 1/26; G06F 1/10; G06F 1/263; G06F 1/266; H02M 3/156; H04L 7/0008
USPC .......................... 713/300, 375, 400, 500, 600
See application file for complete search history.

(56) References Cited

U.S. PATENT DOCUMENTS

| | | | |
|---|---|---|---|
| 2004/0075600 A1* | 4/2004 | Vera ......................... | H02M 1/10 341/166 |
| 2007/0139026 A1* | 6/2007 | Jiang ..................... | H02M 3/285 323/282 |
| 2010/0164570 A1* | 7/2010 | Priego ................. | H02M 3/1584 327/157 |
| 2011/0252193 A1* | 10/2011 | Bains .................... | G11C 11/406 711/E12.001 |
| 2014/0013138 A1* | 1/2014 | Kanai ................... | G06F 1/3237 713/323 |

(Continued)

FOREIGN PATENT DOCUMENTS

| | | |
|---|---|---|
| JP | 2015064676 A | 4/2015 |
| JP | 2015128344 A | 7/2015 |
| JP | 2019208141 | 12/2019 |

OTHER PUBLICATIONS

Notice of Reason for Refusal cited in Japanese Application No. 2020-001708, dated Sep. 26, 2023.

*Primary Examiner* — Ji H Bae
(74) *Attorney, Agent, or Firm* — CHIP LAW GROUP

(57) ABSTRACT

A semiconductor device includes a clock terminal to and from which a clock is allowed to be input and output, and a data terminal to and from which data is allowed to be input and output. In the semiconductor device, the data synchronized with the clock that is input to the clock terminal or is output from the clock terminal is output from the data terminal, and when the clock is output from the clock terminal, the clock is output irrespective of whether or not data transfer of the data is being executed.

8 Claims, 6 Drawing Sheets

(56) References Cited

U.S. PATENT DOCUMENTS

| | | | | |
|---|---|---|---|---|
| 2015/0188427 A1* | 7/2015 | Yorozu | ................ | H02M 3/158 |
| | | | | 323/271 |
| 2020/0226045 A1* | 7/2020 | Le | ............................. | G06F 1/30 |
| 2020/0333818 A1* | 10/2020 | Yun | .......................... | G11C 5/04 |

* cited by examiner

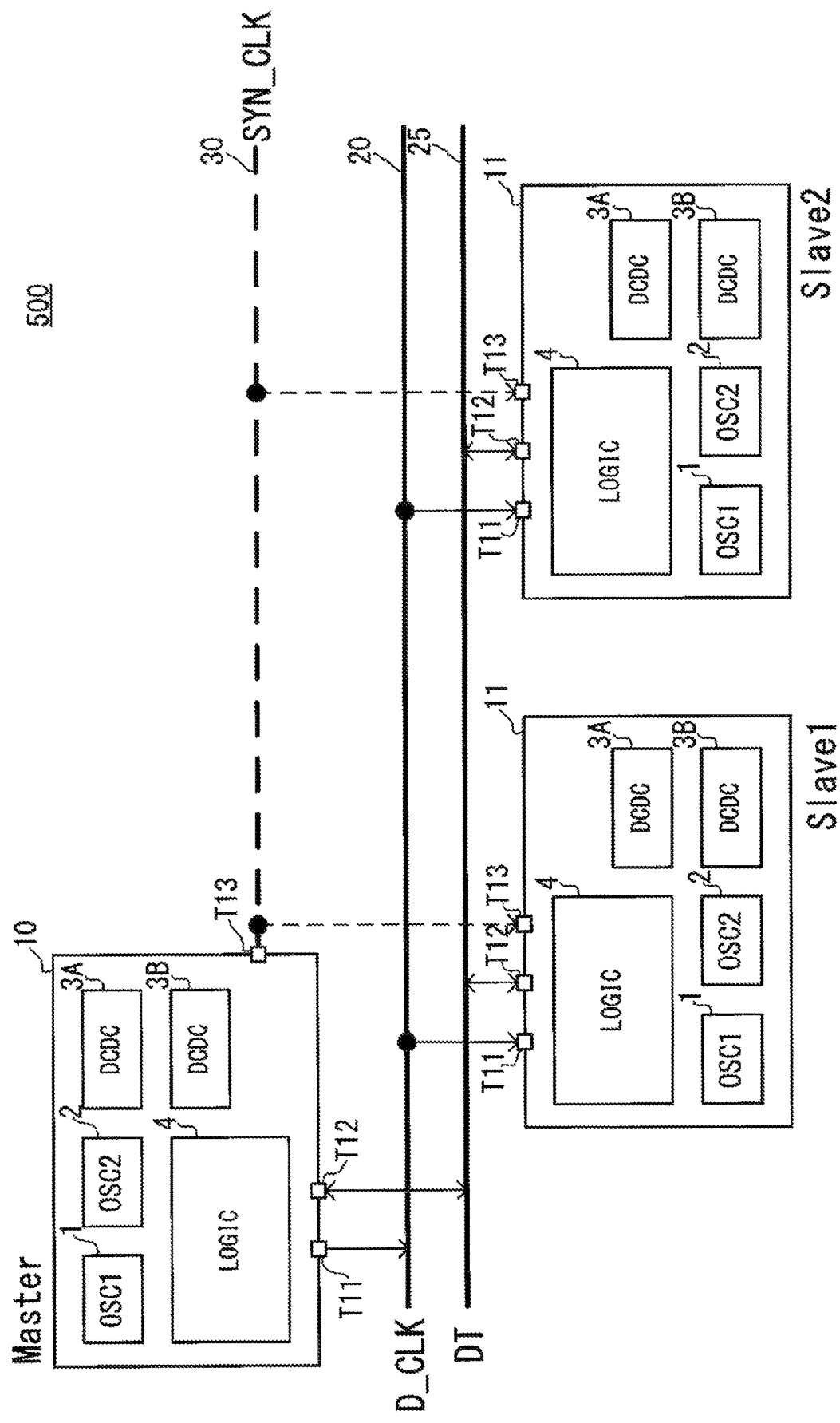

CLOCK AND DATA SIGNAL TRANSMISSION IN A MASTER/SLAVE PMIC SYSTEM

CROSS REFERENCE TO RELATED APPLICATIONS

This application claims priority benefit of Japanese Patent Application No. JP 2020-001708 filed in the Japan Patent Office on Jan. 8, 2020. Each of the above-referenced applications is hereby incorporated herein by reference in its entirety.

BACKGROUND

The present disclosure relates to a semiconductor device.

In the recent years, a semiconductor device called the power management IC (PMIC) has appeared. In the PMIC, a direct current/direct current (DC/DC) block that is a circuit block for a DC/DC converter and a control logic part are integrated into one integrated circuit (IC) chip, and this IC chip is packaged. Plural DC/DC blocks are disposed in many cases (regarding one example of such a PMIC, refer to Japanese Patent Laid-open No. 2019-208141).

SUMMARY

In the PMIC, it is requested to reduce the number of terminals in order to implement a small-size package product.

In view of the above-described circumstance, it is desirable to provide a semiconductor device that enables reduction in the number of terminals.

According to an embodiment of the present disclosure, there is provided a semiconductor device having the following configuration (first configuration). The semiconductor device a clock terminal to and from which a clock is allowed to be input and output and a data terminal to and from which data is allowed to be input and output. The data synchronized with the clock that is input to the clock terminal or is output from the clock terminal is output from the data terminal. When the clock is output from the clock terminal, the clock is output irrespective of whether or not data transfer of the data is being executed.

Furthermore, in the above-described first configuration, a configuration may be employed in which the semiconductor device further has a control logic part and a first oscillator that generates a system clock for the control logic part and the clock is a clock based on the system clock (second configuration).

Moreover, in the above-described first or second configuration, a configuration may be employed in which the semiconductor device further has a DC/DC block that is a circuit block for a DC/DC converter and a second oscillator that generates a clock for DC/DC for the DC/DC block and the clock is a clock based on the clock for DC/DC (third configuration).

Furthermore, in any of the above-described first to third configurations, a configuration may be employed in which the semiconductor device further has a control logic part, a DC/DC block that is a circuit block for a DC/DC converter, a first oscillator that generates a system clock for the control logic part, and a second oscillator that generates a clock for DC/DC for the DC/DC block and whether a clock based on the system clock is employed as the clock or a clock based on the clock for DC/DC is employed as the clock is allowed to be set (fourth configuration).

Moreover, a semiconductor device system according to another embodiment of the present disclosure has the following configuration (fifth configuration). The semiconductor device system has a first semiconductor device with any of the above-described configurations as a master and a second semiconductor device with any of the above-described configurations as a slave. The first semiconductor device as the master outputs the clock, and the clock is input to the second semiconductor device as the slave.

Furthermore, in the above-described fifth configuration, a configuration may be employed in which the semiconductor device system further has a clock line connected to the clock terminal possessed by the first semiconductor device as the master and the clock terminal possessed by the second semiconductor device as the slave and a data line connected to the data terminal possessed by the first semiconductor device as the master and the data terminal possessed by the second semiconductor device as the slave (sixth configuration).

Moreover, in the above-described fifth or sixth configuration, a configuration may be employed in which the first and second semiconductor devices as the master and the slave have a DC/DC block that is a circuit block for a DC/DC converter (seventh configuration).

Furthermore, an in-vehicle system according to another embodiment of the present disclosure has the following configuration (eighth configuration). The in-vehicle system has the semiconductor device system with the above-described seventh configuration and a system-on-a-chip (SOC) to which a supply voltage generated by the DC/DC block is provided.

Moreover, in the above-described eighth configuration, a configuration in which the SOC is an SOC for an electronic control unit (ECU) may be employed (ninth configuration).

According to the semiconductor device of the embodiments of the present disclosure, reduction in the number of terminals is enabled.

BRIEF DESCRIPTION OF THE DRAWINGS

FIG. 7 is a diagram illustrating the configuration of a PMIC system according to a reference example.

DETAILED DESCRIPTION OF THE PREFERRED EMBODIMENT

Reference Example

Figure 1:
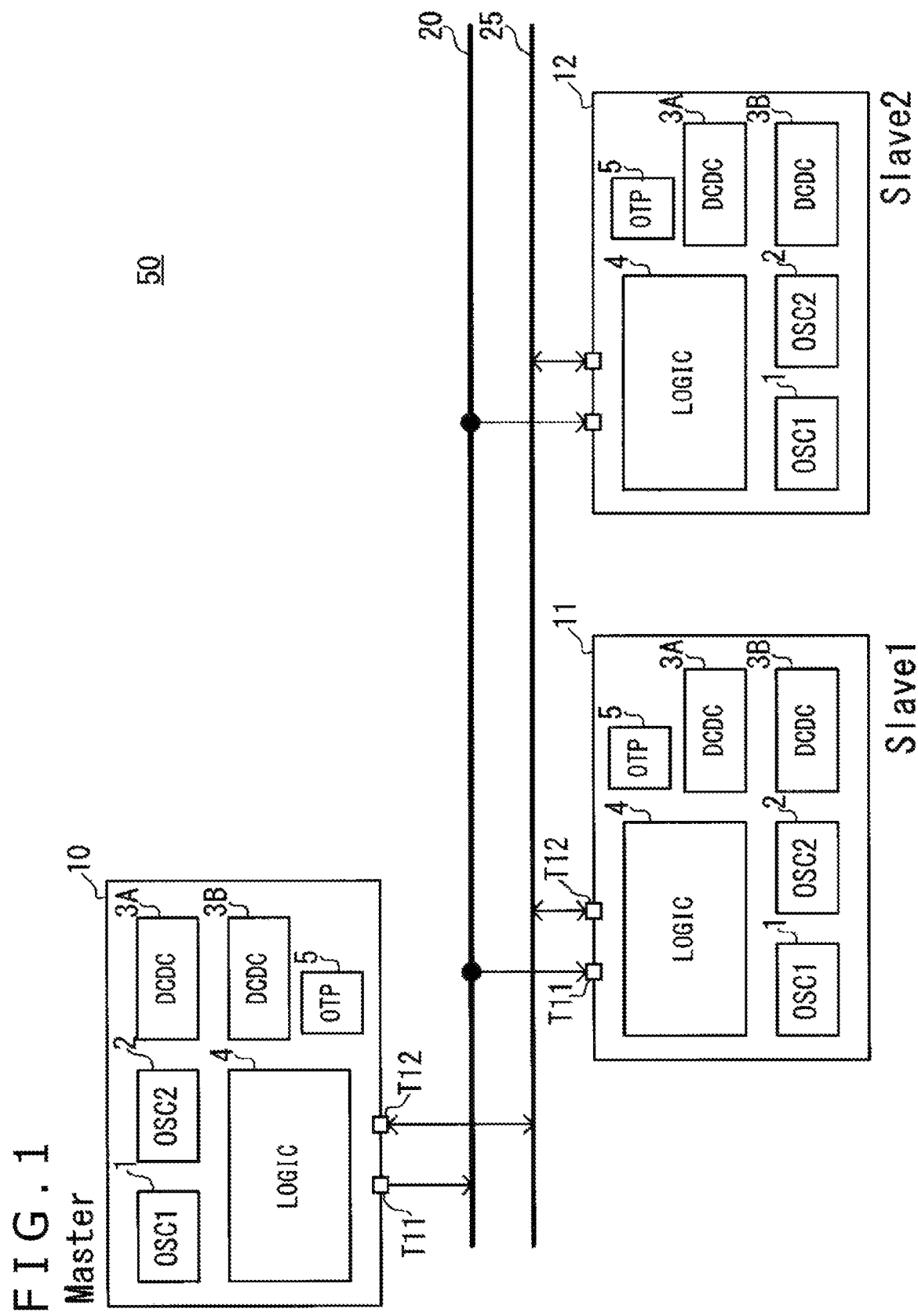
FIG. 1 is a diagram illustrating a configuration of a PMIC system according to an exemplary embodiment of the present disclosure.

First, prior to description regarding an embodiment of the present disclosure, a reference example for understanding features of the embodiment of the present disclosure will be described. FIG. 7 is a diagram illustrating the configuration of a PMIC system 500 according to the reference example.

The PMIC system (semiconductor device system) 500 illustrated in FIG. 7 has PMICs 10, 11, and 12, a clock line 20, a data line 25, and a synchronization clock line 30.

The PMICs 10, 11, and 12 are all a semiconductor device (semiconductor package) that has a first oscillator 1, a second oscillator 2, DC/DC blocks 3A and 3B, and a control logic part 4 that are integrated into one IC chip, and is configured through packaging this IC chip.

In the example of FIG. 7, the PMIC 10 is set as a master, and the PMICs 11 and 12 are each set as a slave. However, the PMICs 10, 11, and 12 can all be set to both the master and the slave. That is, it is also possible to set the PMIC 10 to a slave and set each of the PMICs 11 and 12 to a master. The number of PMICs used as the slave is not limited to two as in the example of FIG. 7 and may be one or may be three or more.

The first oscillator 1 generates a system clock for the control logic part 4. The second oscillator 2 generates a clock for DC/DC for the DC/DC blocks 3A and 3B. The DC/DC blocks 3A and 3B are circuit blocks for a DC/DC converter.

The DC/DC blocks 3A and 3B have a DC/DC controller, a driver, and a switching arm as one example. The switching arm is composed of a high-side switching element and a low-side switching element that are connected in series between a DC supply voltage and a ground potential. The switching elements are configured by a metal oxide semiconductor field effect transistor (MOSFET) or an insulated gate bipolar transistor (IGBT), for example. An inductor and a capacitor connected to the switching arm are disposed outside the PMICs 10, 11, and 12.

The DC/DC blocks 3A and 3B may have only the DC/DC controller, and the driver, the switching elements, and so forth may be disposed outside the PMICs 10, 11, and 12. Furthermore, the number of DC/DC blocks disposed in the PMIC is not limited to two illustrated in FIG. 7, and it is sufficient that the number is one or more. That is, the number of DC/DC blocks disposed in the PMIC may be one or three, for example.

The frequency of the clock for DC/DC generated by the second oscillator 2 defines the switching frequency when the switching elements are driven by the DC/DC blocks 3A and 3B.

The control logic part 4 controls the respective parts of the PMICs 10, 11, and 12. Furthermore, the control logic part 4 generates data for data transfer to be described later.

Furthermore, the PMICs 10, 11, and 12 have a clock terminal T11, a data terminal T12, and a synchronization clock terminal T13 as external terminals (lead terminals) for establishing an electrical connection to the external. The PMICs 10, 11, and 12 have also other external terminals such as a power supply terminal and a enable terminal, for example, although diagrammatic representation is omitted in FIG. 7.

The clock terminal T11 of each of the PMICs 10, 11, and 12 is connected to the clock line 20 disposed outside the PMICs 10, 11, and 12. The data terminal T12 of each of the PMICs 10, 11, and 12 is connected to the data line 25 disposed outside the PMICs 10, 11, and 12.

The PMIC 10 as the master outputs a data clock D_CLK for data transfer from its own clock terminal T11. The output data clock D_CLK is input to the clock terminal T11 of each of the PMICs 11 and 12 as the slaves through the clock line 20.

The PMIC 10 as the master outputs data DT from its own data terminal T12 in synchronization with the data clock D_CLK output by the PMIC 10. The output data DT is input to the data terminals T12 of the PMICs 11 and 12 as the slaves through the data line 25. Furthermore, the PMICs 11 and 12 as the slaves output the data DT from their own data terminal T12 in synchronization with the data clock D_CLK output from the PMIC 10. The output data DT is input to the data terminal T12 of the PMIC 10 through the data line 25. That is, the data transfer can be bi-directionally executed between the master and the slave.

The output of the data clock D_CLK from the PMIC 10 is executed only at the time of data transfer and is not executed at the other timing. Furthermore, the data transfer system does not particularly matter and may be I2C or the like.

Moreover, the synchronization clock terminal T13 of each of the PMICs 10, 11, and 12 is connected to the synchronization clock line 30. The PMIC 10 as the master outputs the system clock generated by its own first oscillator 1 from its own synchronization clock terminal T13 as a synchronization clock SYN_CLK. The output synchronization clock SYN_CLK is input to the synchronization clock terminal T13 of each of the PMICs 11 and 12 as the slaves through the synchronization clock line 30. The PMICs 11 and 12 use the input synchronization clock SYN_CLK as the system clock for their own control logic part 4. This allows synchronization of the system clock between the master and the slave.

The PMIC 10 as the master may output the clock for DC/DC generated by its own second oscillator 2 from its own synchronization clock terminal T13 as the synchronization clock SYN_CLK. In this case, the output synchronization clock SYN_CLK is input to the synchronization clock terminal T13 of each of the PMICs 11 and 12 as the slaves through the synchronization clock line 30. The PMICs 11 and 12 use the input synchronization clock SYN_CLK as the clock for DC/DC for their own DC/DC blocks 3A and 3B. This allows synchronization of the clock for DC/DC between the master and the slave.

As described above, in the configuration illustrated in FIG. 7, synchronization of the clock can be executed between the PMIC of the master and the PMIC of the slave. However, there is a problem that the synchronization clock terminal T13, which is a dedicated terminal, may be necessary for the synchronization and reduction in the size of the package of the PMIC is inhibited. Thus, in the embodiment of the present disclosure to be described later, by improving the configuration illustrated in FIG. 7, synchronization of the clock is enabled while the number of terminals of the PMIC is reduced.

Configuration of PMIC System

An exemplary embodiment of the present disclosure will be described below. FIG. 1 is a diagram illustrating the configuration of a PMIC system 50 according to the exemplary embodiment of the present disclosure. Here, different points from the configuration according to the reference example illustrated in the aforementioned FIG. 7 will be mainly described.

The PMIC system 50 illustrated in FIG. 1 has a PMIC 10 as a master, PMICs 11 and 12 as slaves, a clock line 20, and a data line 25.

The PMICs 10, 11, and 12 each have a one-time programmable (OTP) memory 5 in addition to a first oscillator 1, a second oscillator 2, DC/DC blocks 3A and 3B, and a control logic part 4 similar to those in the configuration according to the reference example in such a manner that these components 1 to 5 are integrated into one IC chip.

Furthermore, the PMICs 10, 11, and 12 do not have the synchronization clock terminal T13 differently from the configuration according to the reference example. Due to this, the PMIC system 50 does not have the synchronization clock line 30 (FIG. 7) differently from the configuration according to the reference example.

Operation of PMIC System

Operation of the PMIC system 50 with such a configuration will be described. Here, in the PMIC system 50, which of a system clock and a clock for DC/DC is to be synchronized is set in the OTP memory 5 of each of the PMICs 10, 11, and 12 in advance.

Figure 2:
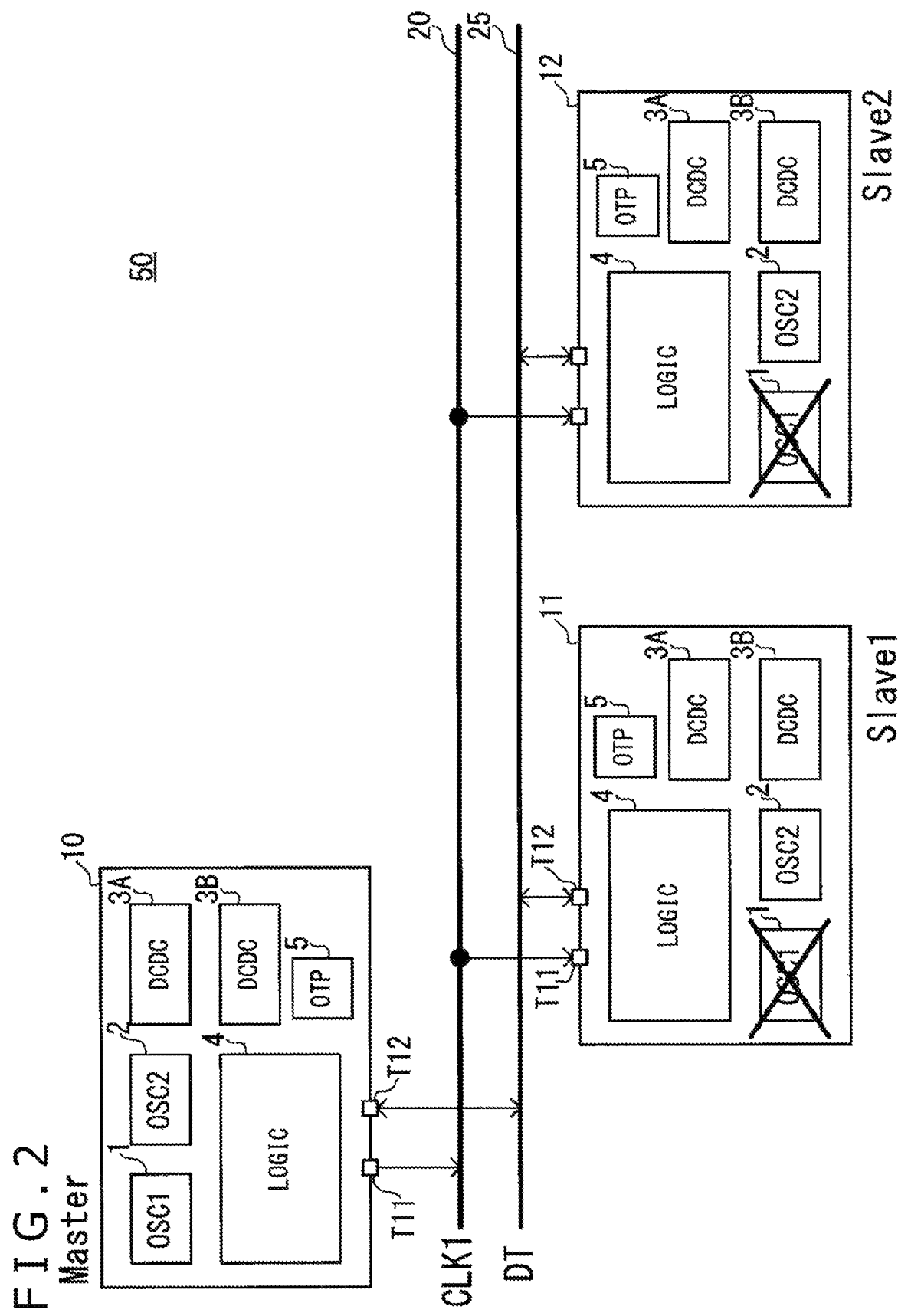
FIG. 2 is a diagram illustrating operation of the PMIC system according to the exemplary embodiment of the present disclosure (when synchronization of a system clock is set)

The following operation is executed when synchronization of the system clock is set in the OTP memory 5. As illustrated in FIG. 2, the PMIC 10 as the master outputs the system clock generated by its own first oscillator 1 from its own clock terminal T11 as a first clock CLK1. The output first clock CLK1 is input to the clock terminal T11 of each of the PMICs 11 and 12 as the slaves through the clock line 20. The PMICs 11 and 12 use the input first clock CLK1 as the system clock for their own control logic part 4. This allows synchronization of the system clock between the master and the slave. At this time, the PMICs 11 and 12 as the slaves may stop the operation of their own first oscillator 1 or avoid using the system clock generated by their own first oscillator 1.

Here, as a feature of the present embodiment, the PMIC 10 that is the master typically outputs the first clock CLK1 from its own clock terminal T11 irrespective of whether or not data transfer to be described later is being executed.

The following operation is executed at the time of the data transfer. The PMIC 10 as the master outputs data DT from its own data terminal T12 in synchronization with the first clock CLK1 output by the PMIC 10. The output data DT is input to the data terminals T12 of the PMICs 11 and 12 as the slaves through the data line 25. Furthermore, the PMICs 11 and 12 as the slaves output the data DT from their own data terminal T12 in synchronization with the first clock CLK1 output from the PMIC 10. The output data DT is input to the data terminal T12 of the PMIC 10 through the data line 25. That is, the data transfer can be bi-directionally executed between the master and the slave.

Figure 4:
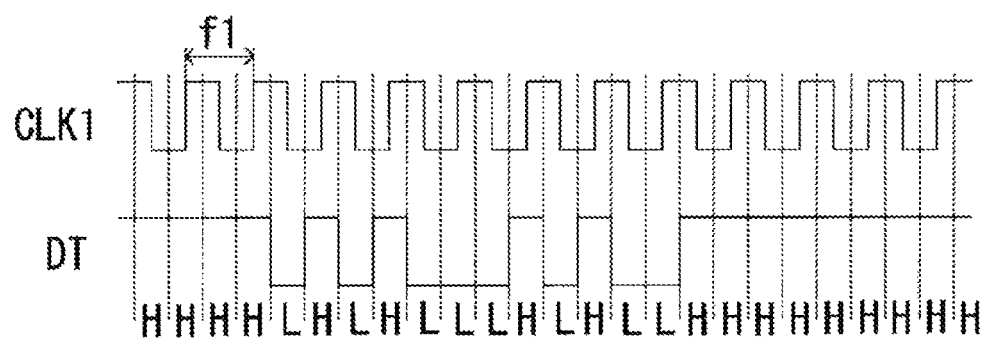
FIG. 4 is a timing chart illustrating a waveform example of a first clock and data.

Here, FIG. 4 is a timing chart illustrating a waveform example of the first clock CLK1 and the data DT output by the PMIC 10 that is the master or the PMICs 11 and 12 that are the slaves. The first clock CLK1 has a pulse waveform in which the high level and the low level are alternately repeated at a predetermined frequency f1. The frequency f1 is 1 MHz, for example.

Timings illustrated by dashed lines illustrated in FIG. 4 are timings at which the high level or the low level of the data DT is output. Specifically, as illustrated in FIG. 4, as the data DT, in response to the rising edge/falling edge of the first clock CLK1, the high level or the low level is output by the timing of the next edge. In this manner, the data DT is output in such a manner as to be synchronized with the first clock CLK1.

As described above, in the present embodiment, the first clock CLK1 is shared between the synchronization of the system clock and the data transfer. Therefore, the synchronization clock terminal T13 like that in the configuration according to the reference example (FIG. 7) becomes unnecessary.

Figure 3:
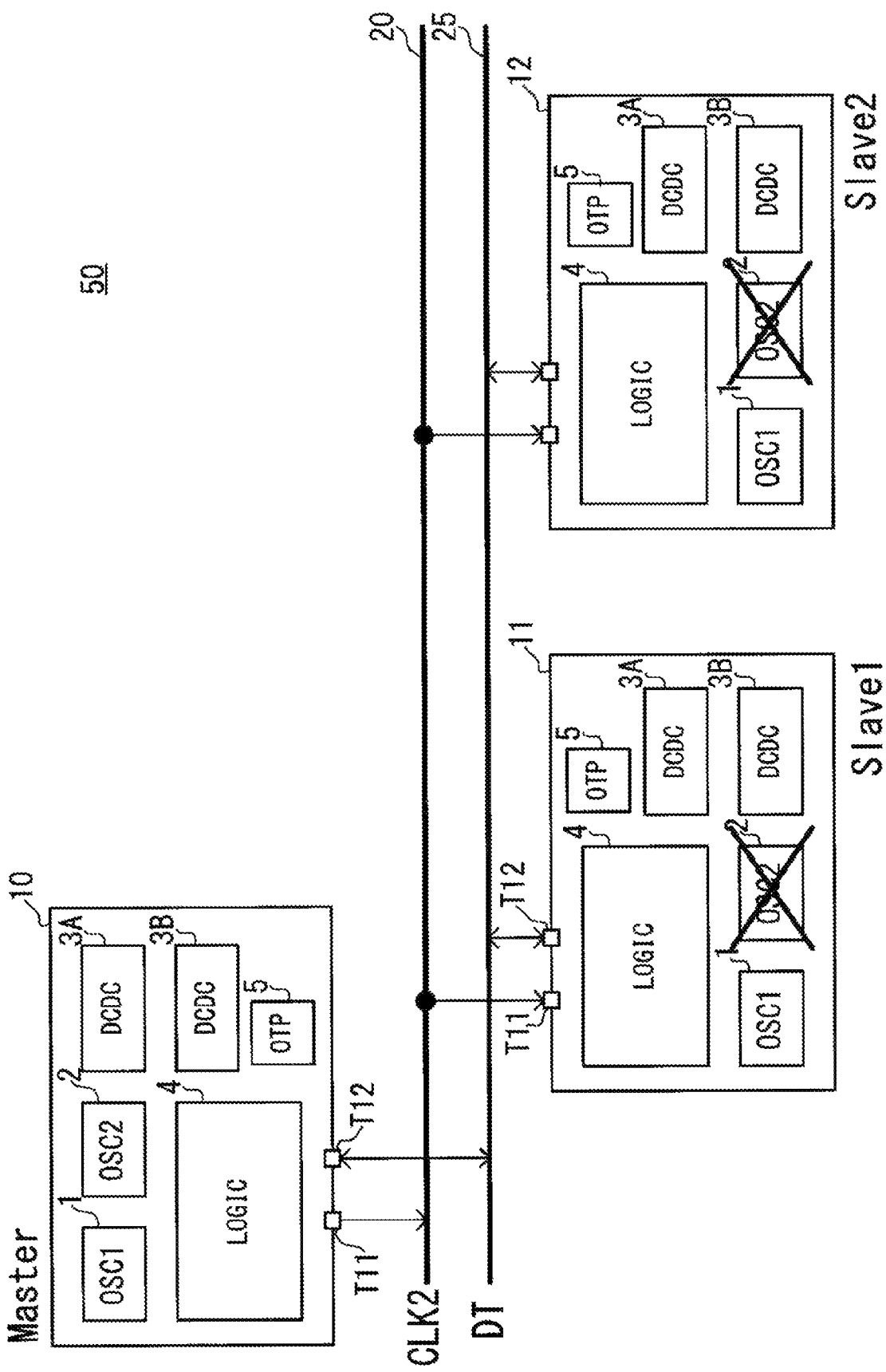
FIG. 3 is a diagram illustrating operation of the PMIC system according to the exemplary embodiment of the present disclosure (when synchronization of a clock for DC/DC is set)

On the other hand, the following operation is executed when synchronization of the clock for DC/DC is set in the OTP memory 5. As illustrated in FIG. 3, the PMIC 10 as the master outputs the clock for DC/DC generated by its own second oscillator 2 from its own clock terminal T11 as a second clock CLK2. The output second clock CLK2 is input to the clock terminal T11 of each of the PMICs 11 and 12 as the slaves through the clock line 20. The PMICs 11 and 12 use the input second clock CLK2 as the clock for DC/DC for their own DC/DC blocks 3A and 3B. This allows synchronization of the clock for DC/DC between the master and the slave. At this time, the PMICs 11 and 12 as the slaves may stop the operation of their own second oscillator 2 or avoid using the clock for DC/DC generated by their own second oscillator 2.

Here, as a feature of the present embodiment, the PMIC 10 that is the master typically outputs the second clock CLK2 from its own clock terminal T11 irrespective of whether or not data transfer to be described later is being executed.

The following operation is executed at the time of the data transfer. The PMIC 10 as the master outputs the data DT from its own data terminal T12 in synchronization with the second clock CLK2 output by the PMIC 10. The output data DT is input to the data terminals T12 of the PMICs 11 and 12 as the slaves through the data line 25. Furthermore, the PMICs 11 and 12 as the slaves output the data DT from their own data terminal T12 in synchronization with the second clock CLK2 output from the PMIC 10. The output data DT is input to the data terminal T12 of the PMIC 10 through the data line 25. That is, the data transfer can be bi-directionally executed between the master and the slave.

Figure 5:
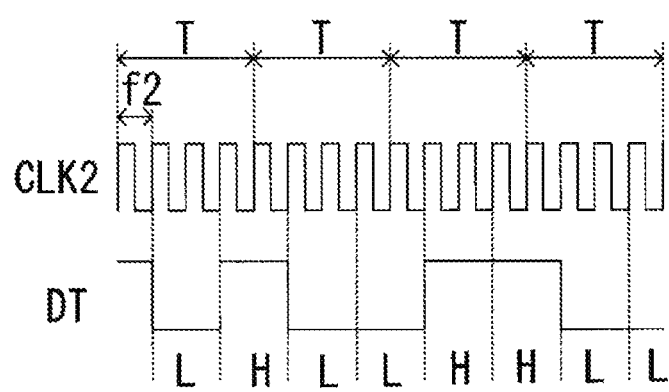
FIG. 5 is a timing chart illustrating a waveform example of a second clock and the data.

Here, FIG. 5 is a timing chart illustrating a waveform example of the second clock CLK2 and the data DT output by the PMIC 10 that is the master or the PMICs 11 and 12 that are the slaves. The second clock CLK2 has a pulse waveform in which the high level and the low level are alternately repeated at a predetermined frequency f2. The frequency f2 is higher than the frequency f1 and is 4 MHz, for example.

Timings illustrated by dashed lines illustrated in FIG. 5 are timings at which the high level or the low level of the data DT is output. Specifically, as illustrated in FIG. 5, the period from the first rising edge of the second clock CLK2 to the fifth rising edge is deemed as one section T. Furthermore, as the data DT, in response to the first rising edge of the second clock CLK2, the high level or the low level is output by the timing of the third rising edge. Then, in response to the third rising edge of the second clock CLK2, the high level or the low level is output by the timing of the fifth rising edge. Through execution of such output every one section T, the data DT is output in such a manner as to be synchronized with the second clock CLK2.

As described above, in the present embodiment, the second clock CLK2 is shared between the synchronization of the clock for DC/DC and the data transfer. Therefore, the synchronization clock terminal T13 like that in the configuration according to the reference example (FIG. 7) becomes unnecessary.

As described above, in the present embodiment, the synchronization clock terminal T13 like that in the configuration according to the reference example becomes unnecessary. Therefore, it becomes possible to reduce the number of terminals, and reduction in the size of the package of the PMIC can be intended.

The interface that outputs the clock and the interface that outputs the data may be configured by an open-drain or be configured by a push-pull circuit, for example. In the case of configuring the interfaces by the open-drain, the clock line 20 and the data line 25 are pulled up to the supply voltage by resistance.

Application Example of PMIC

Figure 6:
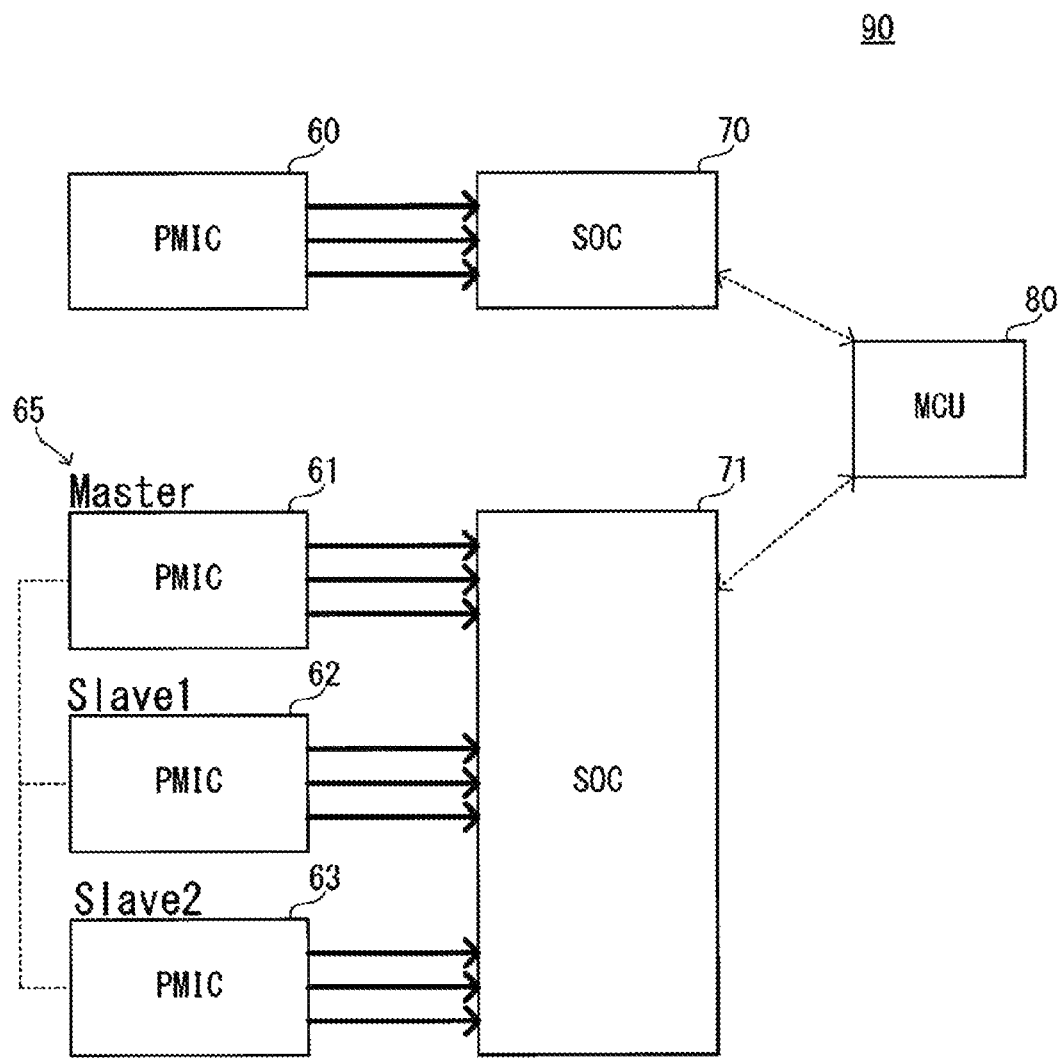
FIG. 6 is a diagram illustrating one example of an in-vehicle system.

FIG. 6 is a block diagram illustrating an in-vehicle system 90 as an application target example of the aforementioned PMIC system according to the embodiment of the present disclosure.

The in-vehicle system 90 illustrated in FIG. 6 has a PMIC 60, a system-on-a-chip (SOC) 70, a PMIC system 65, an SOC 71, and a microcomputer (MCU) 80.

The SOC 70 is an SOC for an in-vehicle camera and is provided with a supply voltage from the PMIC 60. In FIG. 6, the PMIC 60 and PMICs 61, 62, and 63 to be described later each have three-channel DC/DC blocks as one example.

The PMIC system 65 has the PMIC 61 as a master and the PMICs 62 and 63 as slaves. That is, the PMIC 61 corresponds to the PMIC 10 in the aforementioned embodiment and the PMICs 62 and 63 correspond to the PMICs 11 and 12 in the aforementioned embodiment.

The SOC 71 is an SOC for an electronic control unit (ECU) and is provided with a supply voltage from the PMICs 61, 62, and 63. The SOC 71 may need higher power than the SOC 70 and therefore is provided with the supply voltage from the three PMICs.

The MCU 80 is a microcomputer that monitors the SOCs 70 and 71.

Others

It should be considered that the above-described embodiment is exemplification in all respects and is not what is restrictive, and it should be understood that the technical range of the present disclosure is illustrated by not the explanation of the above-described embodiment but by the scope of claims and all changes that belong to meanings and range equivalent to the scope of claims are included therein.

The present disclosure can be used for the PMIC, for example.

What is claimed is:

1. A semiconductor device system, comprising:
   a first semiconductor device as a master, the first semiconductor device including a clock terminal configured to at least one of output or receive a first clock,
   a data terminal configured to at least one of output or receive data in synchronization with the first clock, wherein,
      the synchronized data is output from the data terminal, and
      the first clock is output from the clock terminal irrespective of whether or not data transfer of the synchronized data is being executed; and
   a second semiconductor device having a configuration same as the first semiconductor device, as a slave, wherein
      the first semiconductor device as the master outputs the first clock, and
      the first clock is input to the second semiconductor device which is the slave.

2. The semiconductor device system according to claim 1, further comprising:
   a clock line connected to the clock terminal possessed by the first semiconductor device as the master and a clock terminal possessed by the second semiconductor device as the slave; and
   a data line connected to the data terminal possessed by the first semiconductor device as the master and a data terminal possessed by the second semiconductor device as the slave.

3. The semiconductor device system according to claim 1, wherein the first and second semiconductor devices as the master and the slave each have a direct current/direct current (DC/DC) block that is a circuit block for a DC/DC converter.

4. The semiconductor device system according to claim 1, further comprising:
   a control logic part; and
   a first oscillator configured to generate a system clock for the control logic part, wherein the first clock is a clock based on the system clock.

5. The semiconductor device system according to claim 1, further comprising:
   a direct current/direct current (DC/DC) block that is a circuit block for a DC/DC converter; and
   a second oscillator configured to generate a second clock for the DC/DC block,
   wherein the first clock is a clock based on the second clock.

6. The semiconductor device system according to claim 1, further comprising:
   a control logic part;
   a direct current/direct current (DC/DC) block that is a circuit block for a DC/DC converter;
   a first oscillator configured to generate a system clock for the control logic part; and
   a second oscillator configured to generate a second clock for the DC/DC block,
   wherein one of the system clock or the second clock is set as the first clock.

7. An in-vehicle system, comprising:
   a semiconductor device system including
      a first semiconductor device as a master, the first semiconductor device including
      a clock terminal configured to at least one of output or receive, and
      a data terminal configured to at least one of output or receive data in synchronization with the clock, wherein,
         the synchronized data is output from the data terminal, and
         the clock is output from the clock terminal irrespective of whether or not data transfer of the synchronized data is being executed; and
      a second semiconductor device having a configuration same as the first semiconductor device, as a slave, wherein
         the first semiconductor device as the master outputs the clock,
         the clock is input to the second semiconductor device which is the slave,
         the first and second semiconductor devices as the master and the slave each have a direct current/direct current (DC/DC) block that is a circuit block for a DC/DC converter; and a system-on-a-chip to which a supply voltage is generated by the DC/DC block is provided.

8. The in-vehicle system according to claim 7, wherein the system-on-a-chip is a system-on-a-chip for an electronic control unit.

* * * * *